(12) United States Patent
Yuen et al.

(10) Patent No.: US 11,990,749 B2
(45) Date of Patent: May 21, 2024

(54) POWER SUPPLY CELL AND POWER SUPPLY SYSTEM USING THE SAME

(71) Applicant: ABB Schweiz AG, Baden (CH)

(72) Inventors: Kuenfaat Yuen, Hong Kong (CN); Tinho Li, Hong Kong (CN); Kai Tian, Hebei (CN)

(73) Assignee: ABB E-MOBILITY B.V., Delft (NL)

( * ) Notice: Subject to any disclaimer, the term of this patent is extended or adjusted under 35 U.S.C. 154(b) by 479 days.

(21) Appl. No.: 17/212,593

(22) Filed: Mar. 25, 2021

(65) Prior Publication Data

US 2021/0211050 A1   Jul. 8, 2021

Related U.S. Application Data

(63) Continuation of application No. PCT/CN2018/107984, filed on Sep. 27, 2018.

(51) Int. Cl.
  *H02J 1/10* (2006.01)
  *H02J 7/00* (2006.01)
  *H03K 17/00* (2006.01)

(52) U.S. Cl.
  CPC ............ *H02J 1/108* (2013.01); *H02J 7/0063* (2013.01); *H03K 17/005* (2013.01)

(58) Field of Classification Search
  None
  See application file for complete search history.

(56) References Cited

U.S. PATENT DOCUMENTS 4,706,178 A    11/1987  Hayashi
4,788,452 A *  11/1988  Stanley .................. G05F 1/618
                                                      307/37

(Continued)

FOREIGN PATENT DOCUMENTS

CN      1623272 A    6/2005
CN    102651566 A    8/2012

(Continued)

OTHER PUBLICATIONS

Intellectual Property Office of the P.R. China, International Search Report & Report issued in corresponding Application No. PCT/CN2018/107984, dated Jun. 29, 2019, 9 pp.

(Continued)

*Primary Examiner* — Jeffrey S Zweizig
(74) *Attorney, Agent, or Firm* — Greenberg Traurig, LLP

(57) ABSTRACT

A power supply cell of a power supply system including a first power conversion circuit to output a first DC voltage, a second power conversion circuit to output a second DC voltage, a first controllable unidirectional semiconductor switch to generate a first conduction path from the first power conversion circuit to the second power conversion circuit, a first unidirectional semiconductor switch to generate a second conduction path from the first power conversion circuit to the second power conversion circuit, a second unidirectional semiconductor switch to generate a third conduction path from the first power conversion circuit to the second power conversion circuit, a first low-pass filter, and a controlling unit operative to issue turn-on signal or turn-off signal to the first controllable unidirectional semiconductor switch to supply current to the low-pass filter via the first conduction path or both of the second conduction path and the third conduction path.

12 Claims, 8 Drawing Sheets

(56) References Cited

U.S. PATENT DOCUMENTS

| | | | | |
|---|---|---|---|---|
| 4,814,631 | A * | 3/1989 | Jackson | B60L 15/04 |
| | | | | 307/53 |
| 5,045,990 | A * | 9/1991 | Stanley | H02M 3/335 |
| | | | | 363/43 |
| 5,461,264 | A | 10/1995 | Yang | |
| 6,031,422 | A * | 2/2000 | Ideler | H03F 3/2173 |
| | | | | 324/322 |
| 7,710,067 | B2 * | 5/2010 | Kosaka | B60L 58/21 |
| | | | | 318/812 |
| 8,994,212 | B2 * | 3/2015 | Kurokawa | H02M 3/158 |
| | | | | 307/37 |
| 11,682,914 | B2 * | 6/2023 | Greetham | B60L 58/19 |
| | | | | 320/128 |
| 2006/0203522 | A1 | 9/2006 | Hensel | |
| 2008/0054870 | A1 | 3/2008 | Kosaka et al. | |
| 2013/0342151 | A1 | 12/2013 | Kurokawa et al. | |
| 2014/0239719 | A1 | 8/2014 | Kumar | |
| 2021/0211051 | A1 * | 7/2021 | Yuen | H02J 7/0063 |

FOREIGN PATENT DOCUMENTS

| | | |
|---|---|---|
| CN | 103891117 A | 6/2014 |
| CN | 104201885 A | 12/2014 |
| CN | 204538972 U | 8/2015 |
| WO | WO2012063385 A1 | 5/2012 |
| WO | 2018148932 A1 | 8/2018 |

OTHER PUBLICATIONS

Extended European Search Report, issued by the European Patent Office, regarding corresponding patent application Serial No. EP 18934717.2; dated Mar. 25, 2022; 8 pages.

* cited by examiner

POWER SUPPLY CELL AND POWER SUPPLY SYSTEM USING THE SAME

TECHNICAL FIELD

The invention relates to conversion of DC power input into DC power output, and more particularly to DC to DC power conversion without intermediate conversion into AC power.

BACKGROUND ART

For reducing cost and power loss and increasing efficiency of a power supply, DC power supply cells are electrically switched between series connection and parallel connection are provided. By the series-parallel configurable switching cell using a relatively low rate of power switching devices, the process of converting can achieve a relatively wide range of voltage output or current output. Consequently, the cost spent on the power supply is reduced.

This is particular useful in the technology area of electrical vehicle (EV) charging. The EV charging voltage is getting higher and higher to increase the charging power. For some super EV or bus may need to the charging voltage up to 1000V. Therefore, to cover most of the EVs charging requirement, the charging voltage range now is going to be from 200V to 1000V. To output such a wide range voltage, the traditional topology like single LLC, phase shift topology need to sacrifice its power efficiency a lot because they are operating more far away from its optimal operation point under the wide output voltage range regulation. The conventional solution for extending the output voltage range is to apply the modular series or parallel connection method to two or more isolated/individual power modules (power supply cell). For example, Patent CN 204 538 972 U discloses a wide range output switching power supply, having power source module connected with switch circuit, and sub power source module connected with end of positive pole, where switch circuit is connected with power supply. By using relay of power switches to change the power modules connecting manner, series or parallel, the output voltage and current range can be enlarged. When the power modules are connected in parallel, the output current of the system is extended to be the sum of all connected power modules. The system voltage is enlarged with series connecting of power modules.

BRIEF SUMMARY OF THE INVENTION

However, the constant output power (CP) range of the conventional system cannot be attained by the switching between series and parallel connection because the conventional power supply system's maximum output current has a step drop when the connection of the power modules is changed from parallel to series for increasing the voltage.

Therefore, there is a need of providing a power supply cell and a power supply system using the same to broaden the constant output power range by linearly extending the output voltage and current range for wide output range applications.

It is therefore an objective of the invention to provide a power supply cell of a power supply system. The power supply cell includes a first power conversion circuit operative to output a first DC voltage across its first output positive terminal and first output negative terminal, a second power conversion circuit operative to output a second DC voltage across its second output positive terminal and second output negative terminal, a first controllable unidirectional semiconductor switch operative to generate a first conduction path from the first output positive terminal of the first power conversion circuit to the second output negative terminal of the second power conversion circuit, a first unidirectional semiconductor switch operative to generate a second conduction path from the first output positive terminal of the first power conversion circuit to the second output positive terminal of the second power conversion circuit, a second unidirectional semiconductor switch operative to generate a third conduction path from the first output negative terminal of the first power conversion circuit to the second output negative terminal of the second power conversion circuit, a first low-pass filter and a controlling unit operative to issue turn-on signal or turn-off signal to the first controllable unidirectional semiconductor switch so that the first power conversion circuit and the second power conversion circuit supply current to the low-pass filter via the first conduction path or both of the second conduction path and the third conduction path.

The first low-pass filter can help smooth the power supply cell's output voltage and current in order to achieve a relatively wide linearly constant output power range. By controlling the ratio of series and parallel connection in a switching cycle of the switching frequency by the switching arrangement, both the output voltage and current range of the power supply cell can be enlarged smoothly and linearly with the help of the first low-pass filter.

Preferably, the first low-pass filter includes a first inductive element and an input port across the first output negative terminal and the second output positive terminal.

Preferably, the first low-pass filter further includes an output port for supplying a third DC voltage (power supply cell output voltage) across a positive output port terminal and a negative output port terminal.

According to another objective of present invention, it provides a power supply system. The power supply system includes a first power supply cell, a second power supply cell, a second controllable unidirectional semiconductor switch operative to generate a fourth conduction path from the positive output port terminal of the first power supply cell to the negative output port terminal of the second power supply cell, a fourth unidirectional semiconductor switch operative to generate a fifth conduction path from the positive output port terminal of the first power supply cell to the positive output port terminal of the second power supply cell, a fifth unidirectional semiconductor switch operative to generate a sixth conduction path from the negative output port terminal of the first power supply cell to the negative output port terminal of the second power supply cell, a second low-pass filter, and a controller operative to issue turn-on signal or turn-off signal to the second controllable unidirectional semiconductor switch so that the first power supply cell and the second power supply cell supply current to the second high-frequency filtering device via the fourth conduction path or both of the fifth conduction path and the sixth conduction path. The power supply cell can be used as a sub module to form a wider output voltage and constant power range power supply system.

BRIEF DESCRIPTION OF THE DRAWINGS

The subject matter of the invention will be explained in more detail in the following text with reference to preferred exemplary embodiments which are illustrated in the drawings, in which.

The reference symbols used in the drawings, and their meanings, are listed in summary form in the list of reference symbols. In principle, identical parts are provided with the same reference symbols in the figures.

PREFERRED EMBODIMENTS OF THE INVENTION

Figure 1:
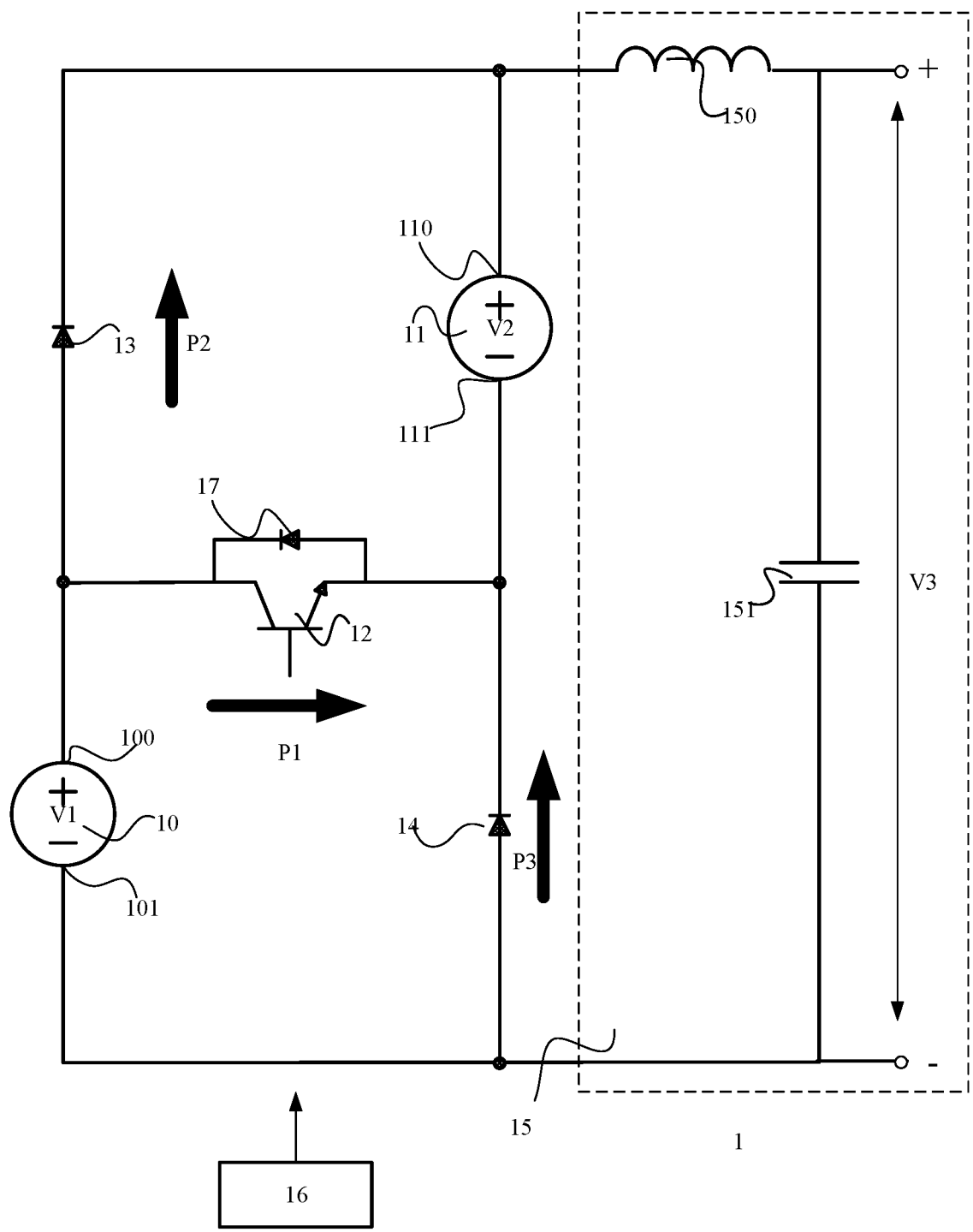
FIG. 1 is a schematic circuit block diagram illustrating a power supply cell according to an embodiment of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "connected" means "directly or indirectly connected", and the term "coupled" means "directly or indirectly connected". FIG. 1 is a schematic circuit block diagram illustrating a power supply cell according to an embodiment of the present invention. As shown in FIG. 1, the power supply cell 1 comprises a first power conversion circuit 10, a second power conversion circuit 11, a first controllable unidirectional semiconductor switch 12, a first unidirectional semiconductor switch 13, a second unidirectional semiconductor switch 14, a first low-pass filter 15 and a controlling unit 16. The first power conversion circuit 10 and the second power conversion circuit 11 are electrically isolated.

By the first power conversion circuit 10, its input voltage is converted into a first DC voltage V1 behaving like a DC voltage source. The first power conversion circuit 10 comprises a first output positive terminal 100 and a first output negative terminal 101. By the second power conversion circuit 11, its input voltage is converted into a second DC voltage V2 behaving like a DC voltage source. The second power conversion circuit 11 comprises a second output positive terminal 110 and a second output negative terminal 111. For example, if their input voltage are AC voltages, either of the first power conversion circuit 10 and the second power conversion circuit 11 may be an AC to DC power converter using conventional AC to DC power conversion circuit topology, such like an AC to DC power converter with transformer isolation. Alternatively, they can be two separated AC to DC power converters each without transformer isolation but electrically coupled to respective secondary side windings of a transformer and the transformer has primary side winding electrically coupled to the AC power source. Their input AC voltages may be supplied from an AC power source or respectively two AC power sources directly or through one or two AC to AC power converter and converted into AC bus voltages, which in turn is/are electrically supplied to the input terminals of the respective first power conversion circuit 10 and the second power conversion circuit 11. As an alternatively, if their input voltage are DC voltages, either of the first power conversion circuit 10 and the second power conversion circuit 11 may be a DC to DC power converter using conventional DC to DC power conversion circuit topology, such like a DC to DC power converter with transformer isolation. Alternatively, they can be two separated DC to DC power converters each without transformer isolation but their input sides are electrically isolated. Their input DC voltages may be supplied from a DC power source or respectively two DC power sources directly or through one or two DC to DC power converter and converted into DC bus voltages, which in turn is/are electrically supplied to the input terminals of the respective first power conversion circuit 10 and the second power conversion circuit 11. The power converter circuit being electrically coupled to either an AC power source or a DC power source, and convert the AC voltage or the DC voltage into the AC or DC bus voltage.

The first controllable unidirectional semiconductor switch 12 is operative to generate a first conduction path P1 from the first output positive terminal 100 of the first power conversion circuit 10 to the second output negative terminal 111 of the second power conversion circuit 11. For example, the first controllable unidirectional semiconductor switch 12 may be power MOSFET or IGBT, whose state is dependent on not only its external power circuit, but also the signal on its driving terminal (this terminal is known as the gate or base). Where MOSFET is used, its drain and source are respectively electrically coupled to the first output positive terminal 100 of the first power conversion circuit 10 to the second output negative terminal 111 of the second power conversion circuit 11; where IGBT is used, its collector and emitter are respectively electrically coupled to the first output positive terminal 100 of the first power conversion circuit 10 to the second output negative terminal 111 of the second power conversion circuit 11. The controlling unit 16 may issue turn-on signal or turn-off signal to the first controllable unidirectional semiconductor switch 12.

The first unidirectional semiconductor switch 13 is operative to generate a second conduction path P2 from the first output positive terminal 100 of the first power conversion circuit 10 to the second output positive terminal 110 of the second power conversion circuit 11. For example, the first unidirectional semiconductor switch 13 may be power diode, body diode of power MOSFET, or a freewheeling diode of IGBT, state is completely dependent on the external power circuit to which it is connected. Forward voltage conducts the first unidirectional semiconductor switch 13, while reverse voltage blocks it. Where a power diode is used, its anode and cathode are respectively electrically coupled to the first output positive terminal 100 of the first power conversion circuit 10 and the second output positive terminal 110 of the second power conversion circuit 11. Where body diode of power MOSFET or a freewheeling diode of IGBT is used, its anode and cathode are respectively electrically coupled to the first output positive terminal 100 of the first power conversion circuit 10 and the second output positive terminal 110 of the second power conversion circuit 11, as well.

The second unidirectional semiconductor switch 14 is operative to generate a third conduction path P3 from the first output negative terminal 101 of the first power conversion circuit 10 to the second output negative terminal 111 of the second power conversion circuit 11. For example, the second unidirectional semiconductor switch 14 may be power diode, body diode of power MOSFET, or a freewheeling diode of IGBT, state is completely dependent on the external power circuit to which it is connected. Forward voltage conducts the second unidirectional semiconductor switch 14, while reverse voltage blocks it. Where a power diode is used, its anode and cathode are respectively electrically coupled to the first output negative terminal 101 of the first power conversion circuit 10 and the second output negative terminal 111 of the second power conversion circuit 11. Where body diode of power MOSFET or a freewheeling diode of IGBT is used, its anode and cathode are respectively electrically coupled to the first output negative terminal 101 of the first power conversion circuit 10 and the second output negative terminal 111 of the second power conversion circuit 11, as well.

The first low-pass filter 15 is operative to pass signals with a frequency lower than a selected cut-off frequency and attenuates signals with frequencies higher than the cut-off frequency. The cut-off frequency may be set based on the requirement of the quality for the DC voltage output. For example, the first low-pass filter 15 may be LC filter and LCL filter. In this embodiment, it uses an LC filter, which a first inductive element 150 and a first capacitive element 151 in series connection and an input port across the first output negative terminal 101 of the first power conversion circuit 10 and the second output positive terminal 110 of the second power conversion circuit 11. The first low-pass filter 15 may further include an output port for supplying a third DC voltage V3 across a positive output port terminal and a negative output port terminal.

By issuing the turn-on signal or turn-off signal to the first controllable unidirectional semiconductor switch 12, the controlling unit 16 may control the first power conversion circuit 10 and the second power conversion circuit 11 to supply current to the low-pass filter 15 via the first conduction path P1 or both of the second conduction path and the third conduction path P2, P3.

Figure 2A:
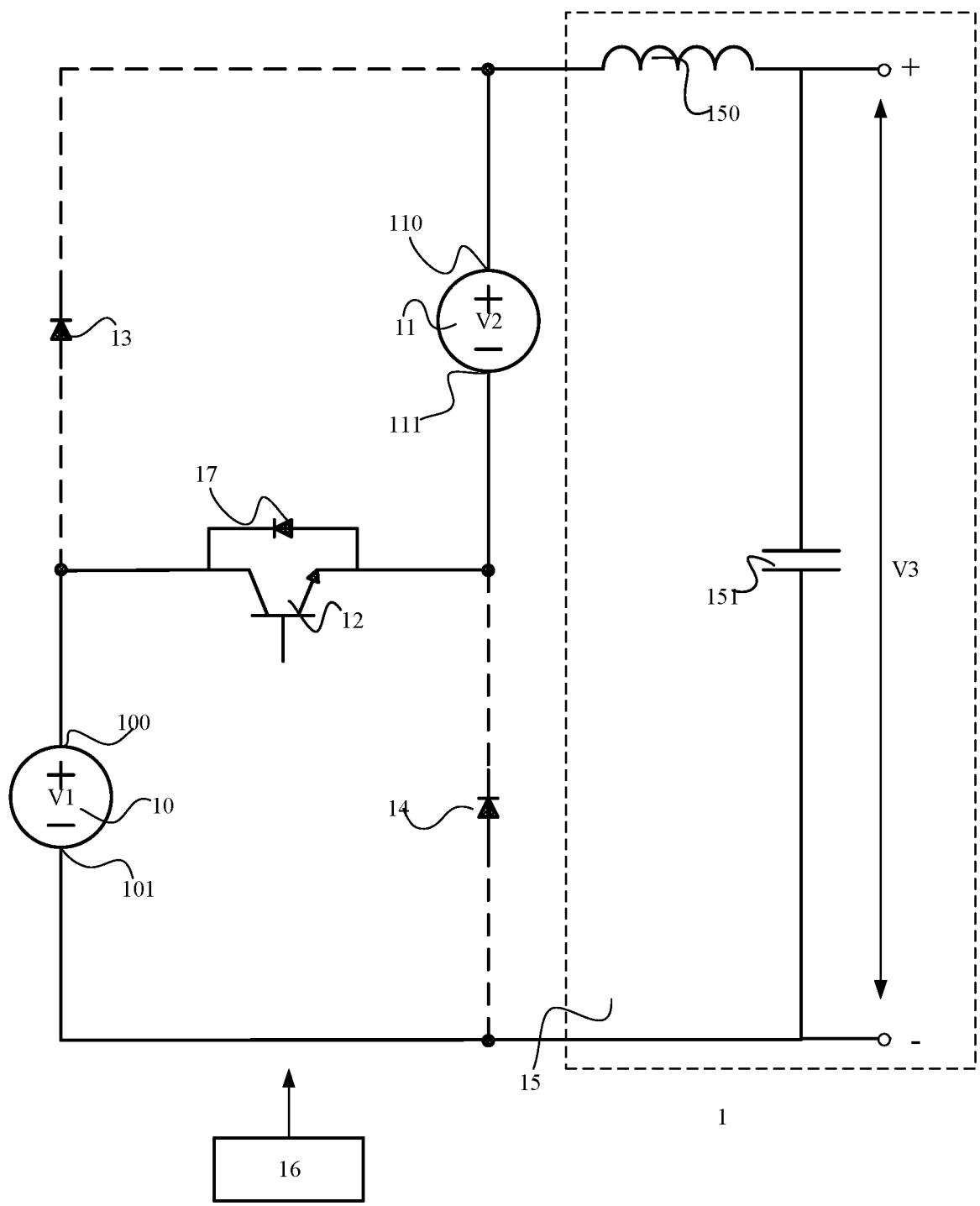
FIGS. 2A and 2B show two operation modes of the apparatus according to an embodiment of present invention.
Figure 2B:
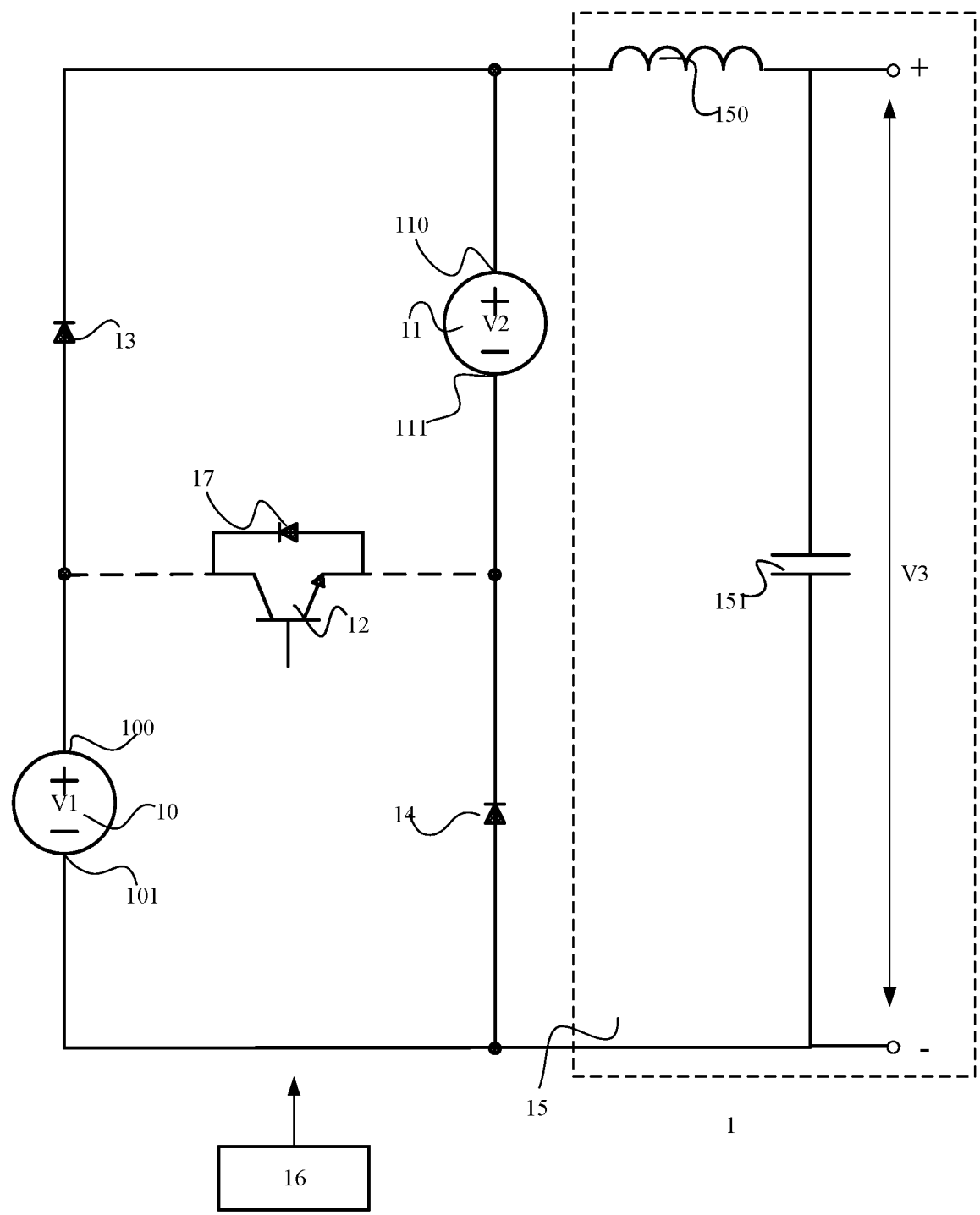

FIGS. 2A and 2B show two operation modes of the apparatus according to an embodiment of present invention. According to the first DC voltage V1 and the second DC voltage V2, the controlling unit 16 issues control signal PWM to the first controllable unidirectional semiconductor switch 12. Preferably, the controlling unit 16 is further operative to issue control signal to the first power conversion circuit 10 and the second power conversion circuit 11 so that the first DC voltage V1 is substantially equal to the second DC voltage V2. For example, the magnitudes of the first DC voltage V1 and the second DC voltage V2 are regulated equal to V. As shown in FIG. 2A, when the first controllable unidirectional semiconductor switch 12 is turned on, the first unidirectional semiconductor switch 13 and the second unidirectional semiconductor switch 14 are OFF due to reverse bias, then the outputs of the first power conversion circuit 10 and the second power conversion circuit 11 are connected in series by the first controllable unidirectional semiconductor switch 12. As shown in FIG. 2B, when the first controllable unidirectional semiconductor switch 12 is turned off, the outputs of the first power conversion circuit 10 and the second power conversion circuit 11 are connected in parallel through the forward biased first unidirectional semiconductor switch 13 and the second unidirectional semiconductor switch 14. By switching the first controllable unidirectional semiconductor switch 12 between ON and OFF with a ratio (PWM method), the apparatus 1 is able to regulate the third DC voltage V3 between V to 2V with the help of the first low-pass filter 15. A power conversion circuit to output a DC voltage has to be used here because PWM modulation requires power input from DC voltage source. The first low-pass filter 15 works to smooth the third DC voltage V3 as an output voltage and current in order to achieve a relatively wide linearly constant output power range. By controlling the ratio of series and parallel connection in a switching cycle of the switching frequency by the switching arrangement, both output voltage (the third DC voltage V3 across the first low-pass filter 15 and current range of the power supply cell can be enlarged smoothly and linearly with the help of the first low-pass filter 15. Besides, there is no modification required for the first power conversion circuit 10 and the second power conversion circuit 11.

Figure 3A:
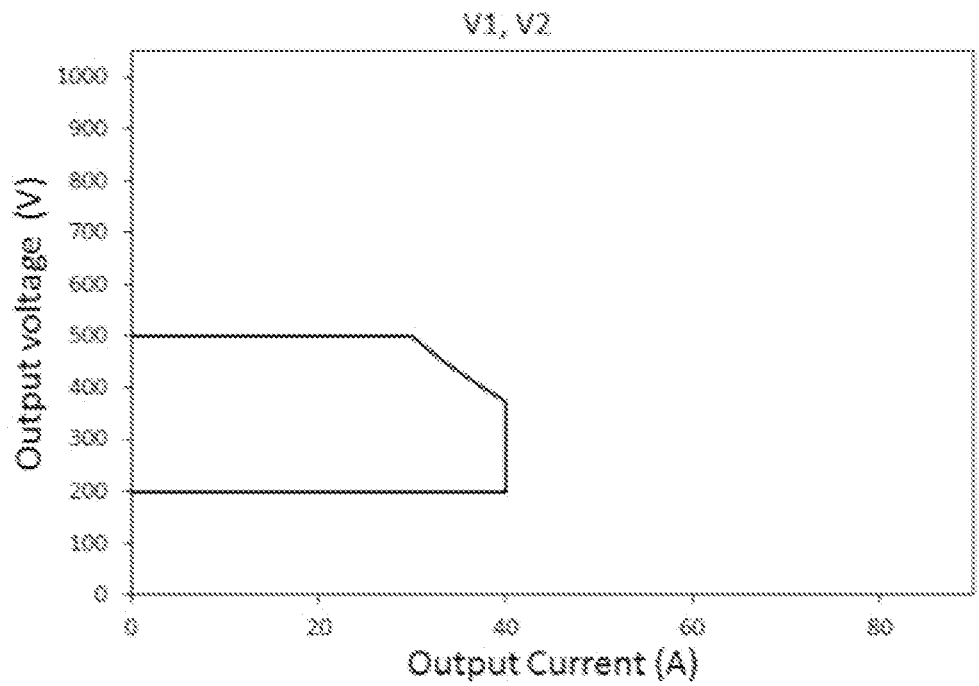
FIG. 3A shows V-I curve according to the power conversion circuit supplying DC voltage.

FIG. 3A shows V-I curve according to the power conversion circuit supplying DC voltage. It is assumed that the two power conversion circuits each has the parameters and both of them operate outputting DC output voltages with substantially the same amplitude:

power capacity: 15 kW;
output voltage range: 200V to 500V;
maximum output current 40 A.

Its output voltage can be adjusted continuously in the range from 200 V to 500 V, while the maximum output power is 15 kW and the maximum output current is 40 A.

Figure 3B:
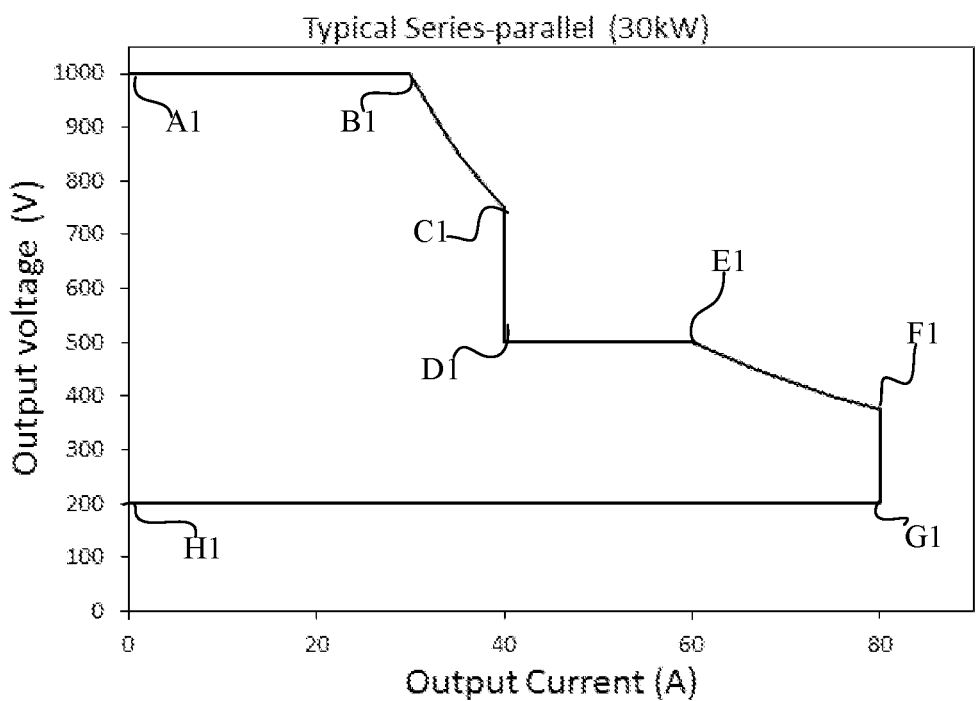
FIG. 3B shows V-I curve according to an exemplified operation of the prior art solution using the power conversion circuits from FIG. 3A.

FIG. 3B shows V-I curve according to an exemplified operation of the prior art solution using the power conversion circuits from FIG. 3A. According to the prior art, the two power conversion circuits supplying two DC output voltages switched between series-connection and paralleling-connection but their supplying powers feed to the load without passing through a low frequency filter having an inductive element. Its output voltage can be adjusted continuously in the range from 200 V to 1000 V while the maximum output power is rated at 30 kW (15 kW*2) and the maximum current is rated at 80 A (40 A*2).

In order the output the DC voltage at a maximum amplitude, 1000 V, the two power conversion circuits have to be electrically coupled in series by appropriately setting the ON and OFF mode of the switching mechanism. For example, if the load resistance is reduced, while the output voltage reference is still set to 1000 V, the operating point can be changed from points A1 (1000 V, 0 A) to B1 (1000 V, 30 A). If the load resistance continues to decrease, the maximum output power of 30 kW and the maximum current of 40 A have to be complied with, since there is no low-pass filter having an inductive element inserted between the output sides of the power conversion circuits and the load, and thus the operating point should be changed from points B1 (1000 V, 30 A) to C1 (750 V, 40 A). If the load resistance keeps decreasing, the maximum current for each power conversion circuit, 40 A, imposes limitation for moving the operating point in the direction along the increase of current. Thus, the electrical coupling relationship has to be changed from series-connection to paralleling-connection, and the operating point is changed from points C1 (750 V, 40 A) to D1 (500 V, 40 A). Starting from the operating point D1 (500 V, 40 A), with the decrease of the load resistance, the operating point can be changed from D1 (500 V, 40 A) to E1 (500 V, 60 A). When reaching E1 (500 V, 60 A) and with the decrease of the load resistance, the operating point can continue to move along the curve along the current increase direction with power output constantly at the maximum output power of 30 kW, here the operating point can move from E1 (500 V, 60 A) to F1 (375 V, 80 A). When reaching F1 (375 V, 80 A), if the load resistance increases, the operating point can shift from F1 (375 V, 80 A) to G1 (200 V, 80 A), and further from G1 (200 V, 80 A) to H1 (200 V, 0 A) along the direction of current decrease. The skilled person shall understand that the operating point moving direction can be changed where for each of the potions of the V-I curve their situations are changed, for example the load resistance changes from decrease to increase, or the electrical coupling relationship changes from paralleling-connection to series-connection. Besides, the operating point can reach any of the points enclosed by the I-V curve by changing the output DC voltage/output current from the power conversion circuit.

Figure 3C:
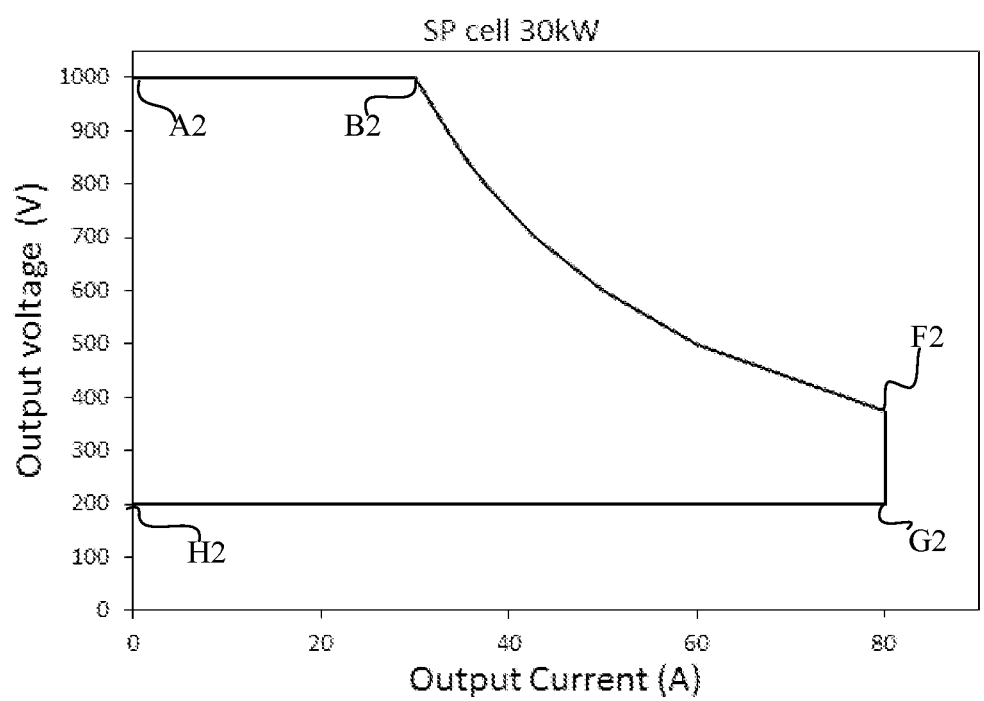
FIG. 3C shows V-I curve according to an exemplified operation of the solution according to present invention using the power conversion circuits from FIG. 3A.

In contrast, FIG. 3C shows V-I curve according to an exemplified operation of the solution according to present invention using the power conversion circuits from FIG. 3A. According to the embodiment of present invention as shown in FIG. 1, the two power conversion circuits 10, 11 supplying two DC output voltages are switched between series-connection and paralleling-connection with their supplying powers fed to the load passing through a low frequency filter 15 having an inductive element 150. The key principle is the tendency of the inductive element to resist changes in current by creating and destroying a magnetic field. The electrical coupling relationship between the power conversion circuits 10, 11 can be switched between series-connection and paralleling connection by consistently applying control signal of PWM to the control terminal of the controllable unidirectional semiconductor switch 12. When the electrical coupling relationship is changed from paralleling connection to series connection, current flows through the inductive element in clockwise direction and the inductive element 150 stores some energy by generating a magnetic field. Polarity of the left side of the inductor is positive. Where the electrical coupling relationship is changed from series connection to paralleling connection, a reversed voltage will be applied across the inductive element 150. The magnetic field previously created will be destroyed to maintain the current towards the load. Thus the polarity will be reversed (means left side of inductor will be negative now). As a result, the inductive element 150 will be in series causing a higher voltage to charge the capacitive element 151 of the first low-pass filter 15.

If the controllable unidirectional semiconductor switch 12 is cycled fast enough, like by PWM, the inductive element 150 will not discharge fully in between charging stages, and the load will always see a voltage greater than that of the power conversion circuit 10, 11 when the switch 12 is opened. Also while the switch 12 is closed, the capacitive element 151 in parallel with the load is charged to the combined voltage of the output voltage of the power conversion circuit 10, 11 and the voltage induced across the inductive element 150. When the switch is then open, the capacitive element 151 is therefore able to provide the voltage and energy to the load. During this time, the blocking diode 13, 14 prevents the capacitive element 151 from discharging through the switch 12. The switch must of course be opened again fast enough to prevent the capacitive element 151 from discharging too much.

In order to maintain the output DC voltage at a maximum amplitude, 1000 V, the two power conversion circuits have to be electrically coupled in series by appropriately setting the ON and OFF mode of the switching mechanism. For example, if the load resistance is reduced, while the output voltage reference is still set to 1000 V, the operating point can be changed from points A2 (1000 V, 0 A) to B2 (1000 V, 30 A).

If the load resistance continues to decrease, the maximum output power of 30 kW and the maximum current of 40 A have to be complied with. Since there is a low-pass filter 15 having an inductive element 150 and the capacitive element 151 inserted between the output sides of the power conversion circuits 10, 11 and the load, the operating point can be smoothly changed from points B2 (1000 V, 30 A) to F2 (375 V, 80 A) with frequent switching the electrically coupling relationship between the power conversion circuits 10, 11 by consistently applying control signal of PWM to the control terminal of the controllable unidirectional semiconductor switch 12. The skilled person should understand that the switching frequency of PWM is relatively high, and its duty ratio varies from 0 to 1, which meets the technical requirement as discussed above. When reaching F2 (375 V, 80 A), if the load resistance increases, the operating point can shift from F2 (375 V, 80 A) to G2 (200 V, 80 A), and further from G2 (200 V, 80 A) to H2 (200 V, 0 A) along the direction of current decrease. The skilled person shall understand that the operating point moving direction can be changed where for each of the potions of the V-I curve their situations are changed, for example the load resistance changes from decrease to increase, or the electrical coupling relationship changes from paralleling-connection to series-connection. Besides, the operating point can reach any of the points enclosed by the I-V curve by changing the output DC voltage/output current from the power conversion circuit.

By comparing the prior art solution and that according to present invention, it can be observed that with the increase of the output voltage, there is an abrupt drop of output current from 60 A to 40 A where the output voltage reaches 500 V, and the output voltage is maintained at 500 V until the output current increases to 60 A according to FIG. 3B. In contrast according to FIG. 3C, because the first low-pass filter 15 works to smooth the output voltage (the third DC voltage V3, as a result of PWM modulation of the first DC voltage V1 and the second DC voltage V2) and output current according to present invention, the portion of the output V-I curve between the output currents at 40 A and 60 A becomes more smooth and thus it can be observed that a relatively constant output power can be achieved. By using the power supply cell according to present invention, it can be observed that it is able to provide continuous constant full power (CP), 30 kW from 375V to 1000V output. In contrast, if the conventional is used, it losses the constant full power output at the range from 500V to 750V.

Figure 4A:
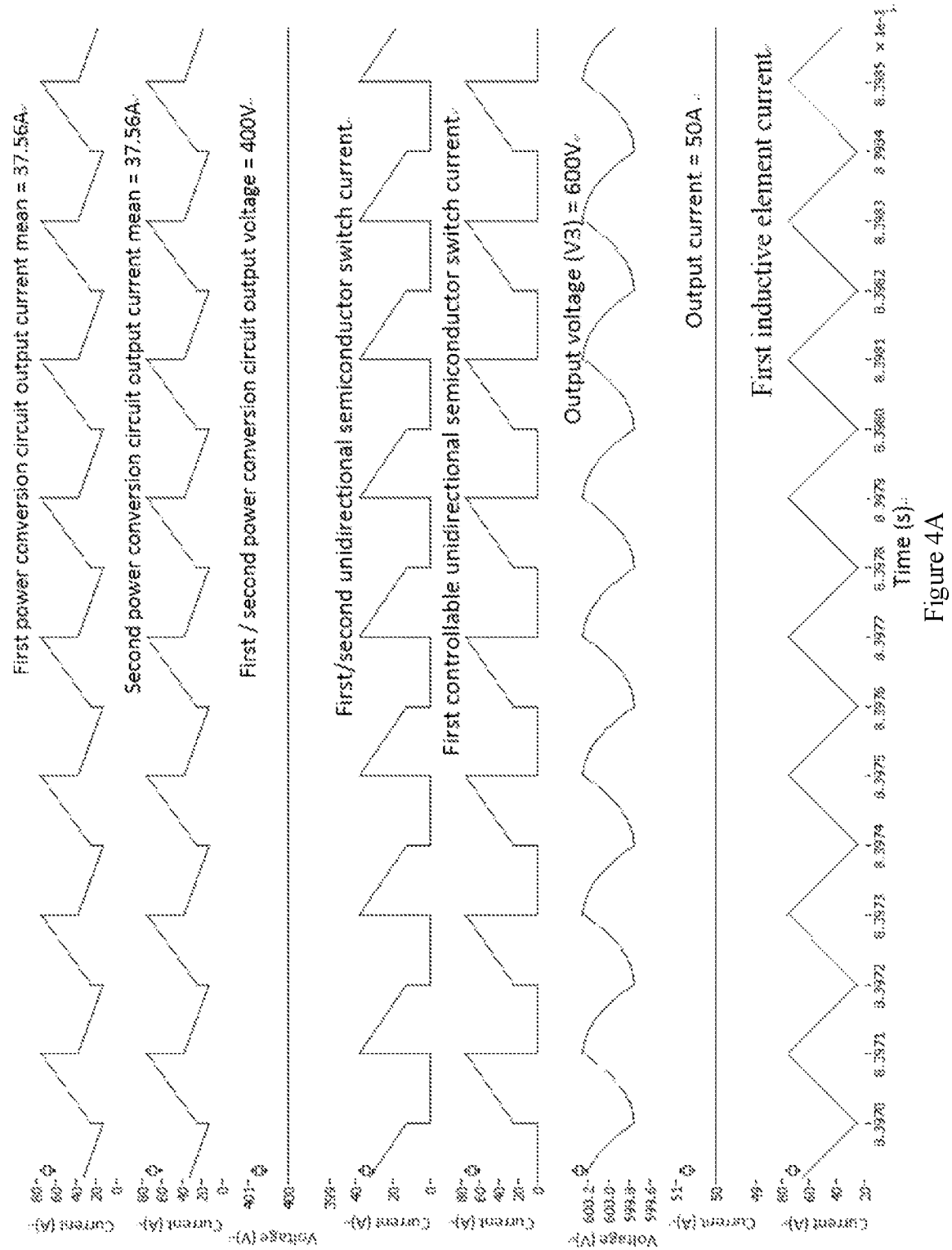
FIGS. 4A and 4B respectively show electrical waveforms involving the components of the power supply cell supplying constant power of 30 kW at two output DC voltage levels respectively at 600V and 700V according to present invention.
Figure 4B:
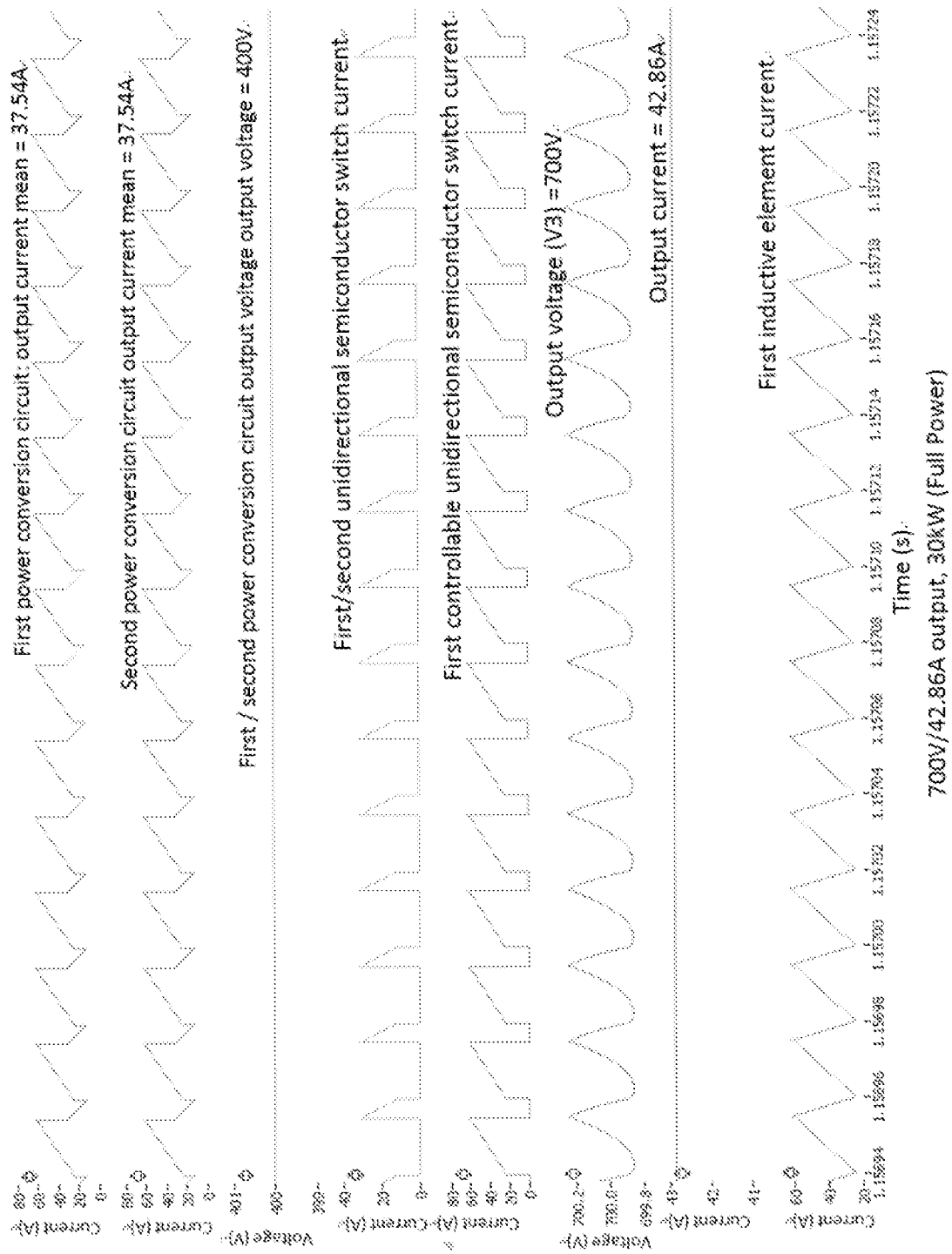

FIGS. 4A and 4B respectively show electrical waveforms involving the components of the power supply cell supplying constant power of 30 kW at two output DC voltage levels respectively at 600V and 700V according to present invention. As shown in FIGS. 4A and 4B, the output voltage from either of the two power conversion circuits of the power supply cell has to be DC voltage. Otherwise, if the power conversion circuit does not behave like a DC voltage source, but for example a DC current source. Besides, by varying the ratio of the PWM signal applied to the first controllable unidirectional semiconductor switch 12, the output voltage of the power supply cell can be controlled with the constant power output. For example, for the constant output power, the PWM signal at ratio of 0.5 gets the output voltage at 600V, and the PWM signal at ratio of 0.75 gets the output voltage at 700 V.

Moreover, the apparatus 1 has a third unidirectional semiconductor switch 17 electrically connected with the first controllable unidirectional semiconductor switch 12 in anti-parallel. The third unidirectional semiconductor switch 17 can be a power diode or a body diode of a power MOSFET of the first controllable unidirectional semiconductor switch 12.

Figure 5:
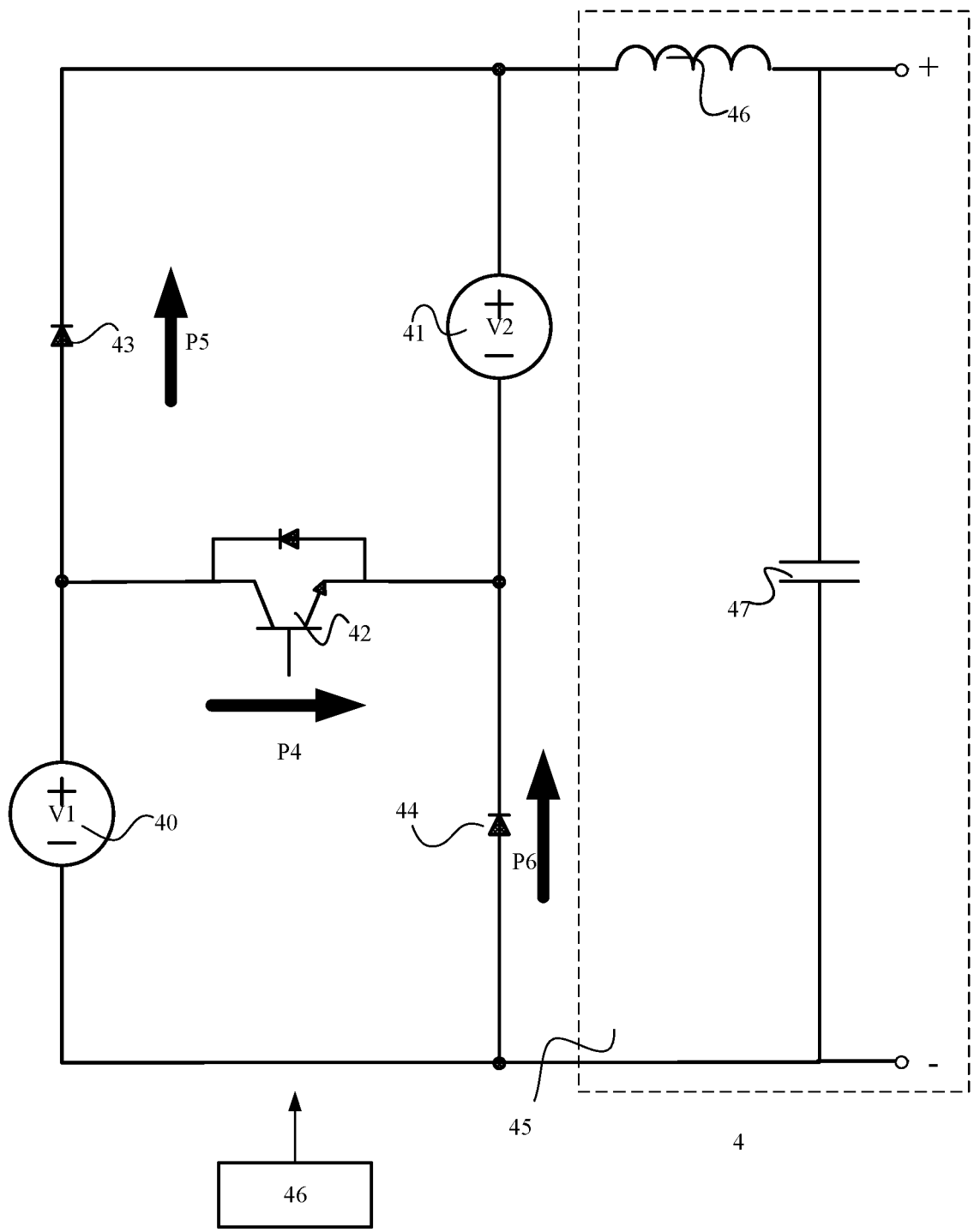
FIG. 5 is a schematic circuit block diagram illustrating a power supply system using the power supply cell according to an embodiment of the present invention.

FIG. 5 is a schematic circuit block diagram illustrating a power supply system using the power supply cell according to an embodiment of the present invention. The power supply cell can be used as a sub module to from an even wider output voltage and constant power range power supply system. As shown in FIG. 5, the power supply system 4 has a similar topology to the power supply cell according to FIG. 1 except that the first power conversion circuit 10 and the second power conversion circuit 11 of the power supply cell 1 are respectively replaced by two power supply cells each using the topology according to FIG. 1. The power supply system 4 includes a first power supply cell 40 and a second power supply cell 41. Either of the two cells can use the one according to FIG. 1. The power supply system 4 further includes a second controllable unidirectional semiconductor switch 42 operative to generate a fourth conduction path P4 from the positive output port terminal of the first power supply cell 40 to the negative output port terminal of the second power supply cell 41, a fourth unidirectional semiconductor switch 43 operative to generate a fifth conduction path P5 from the positive output port terminal of the first power supply cell 40 to the positive output port terminal of the second power supply cell 41, and a fifth unidirectional semiconductor switch 44 operative to generate a sixth conduction path P6 from the negative output port terminal of the first power supply cell 40 to the negative output port terminal of the second power supply cell 41, a second low-pass filter 45, and a controller 46 operative to issue turn-on signal or turn-off signal to the second controllable unidirectional semiconductor switch 42 so that the first power supply cell 40 and the second power supply cell 41 supply current to the second low-pass filter 45 via the fourth conduction path P4 or both of the fifth conduction path P5 and the sixth conduction path P6. By using the power supply system, it is able to output the voltage from V to 4V by changing the status of the switches with constant output power.

Moreover, the second low-pass filter 45 includes a second inductive element 46 and an input port across the negative output port terminal of the first power supply cell 40 and the positive output port terminal of the second power supply cell 41.

Moreover, the power supply system 4 further includes a sixth unidirectional semiconductor switch 47 electrically connected with the second controllable unidirectional semiconductor switch 42 in anti-parallel.

Moreover, the controller is further operative to issue control signal to the first power supply cell and the second power supply cell so that DC output voltage from the first power supply cell is substantially equal to DC output voltage from the second power supply cell.

Though the present invention has been described on the basis of some preferred embodiments, those skilled in the art should appreciate that those embodiments should by no way limit the scope of the present invention. Without departing from the spirit and concept of the present invention, any variations and modifications to the embodiments should be within the apprehension of those with ordinary knowledge and skills in the art, and therefore fall in the scope of the present invention which is defined by the accompanied claims.

The invention claimed is:
1. A power supply system, including:
a first power supply cell and a second power supply cell, the first power supply cell and the second power supply cell each including:
a first power conversion circuit operative to output a first DC voltage across its first output positive terminal and first output negative terminal;
a second power conversion circuit operative to output a second DC voltage across its second output positive terminal and second output negative terminal;
a first controllable unidirectional semiconductor switch operative to generate a first conduction path from the first output positive terminal of the first power conversion circuit to the second output negative terminal of the second power conversion circuit;
a first unidirectional semiconductor switch operative to generate a second conduction path from the first output positive terminal of the first power conversion circuit to the second output positive terminal of the second power conversion circuit;
a second unidirectional semiconductor switch operative to generate a third conduction path from the first output negative terminal of the first power conversion circuit to the second output negative terminal of the second power conversion circuit;
a first low-pass filter; and
a controlling unit operative to issue turn-on signal or turn-off signal to the first controllable unidirectional semiconductor switch so that the first power conversion circuit and the second power conversion circuit supply current to the low-pass filter via the first conduction path or both of the second conduction path and the third conduction path;
a second controllable unidirectional semiconductor switch operative to generate a fourth conduction path from the positive output port terminal of the first power supply cell to the negative output port terminal of the second power supply cell;
a fourth unidirectional semiconductor switch operative to generate a fifth conduction path from the positive output port terminal of the first power supply cell to the positive output port terminal of the second power supply cell;
a fifth unidirectional semiconductor switch operative to generate a sixth conduction path from the negative output port terminal of the first power supply cell to the negative output port terminal of the second power supply cell;
a second low-pass filter; and
a controller operative to issue turn-on signal or turn-off signal to the second controllable unidirectional semiconductor switch so that the first power supply cell and the second power supply cell supply current to the second low-pass filter via the fourth conduction path or both of the fifth conduction path and the sixth conduction path;
wherein the controller is further operative to issue control signal to the first power supply cell and the second power supply cell so that DC output voltage from the first power supply cell is substantially equal to DC output voltage from the second power supply cell.

2. The power supply system according to claim 1, wherein:
the second low-pass filter includes a second inductive element and an input port across the negative output port terminal of the first power supply cell and the positive output port terminal of the second power supply cell.

3. The power supply system according to claim 1, which further includes:
a sixth unidirectional semiconductor switch electrically connected with the second controllable unidirectional semiconductor switch in anti-parallel.

4. The power supply system according to claim 1, which further includes a third unidirectional semiconductor switch electrically connected with the first controllable unidirectional semiconductor switch in anti-parallel.

5. The power supply system according to claim 1, wherein the controlling unit is further operative to issue control signal to the first power conversion circuit and the second power conversion circuit so that the first DC voltage is substantially equal to the second DC voltage.

6. A power supply cell of a power supply system, including:
a first power conversion circuit operative to output a first DC voltage across its first output positive terminal and first output negative terminal;
a second power conversion circuit operative to output a second DC voltage across its second output positive terminal and second output negative terminal;
a first controllable unidirectional semiconductor switch operative to generate a first conduction path from the first output positive terminal of the first power conversion circuit to the second output negative terminal of the second power conversion circuit;
a first unidirectional semiconductor switch operative to generate a second conduction path from the first output positive terminal of the first power conversion circuit to the second output positive terminal of the second power conversion circuit;
a second unidirectional semiconductor switch operative to generate a third conduction path from the first output negative terminal of the first power conversion circuit to the second output negative terminal of the second power conversion circuit;
a first low-pass filter; and
a controlling unit operative to issue turn-on signal or turn-off signal to the first controllable unidirectional semiconductor switch so that the first power conversion circuit and the second power conversion circuit supply current to the low-pass filter via the first conduction path or both of the second conduction path and the third conduction path,
wherein the controlling unit is further operative to issue control signal to the first power conversion circuit and the second power conversion circuit so that the first DC voltage is substantially equal to the second DC voltage.

7. The power supply cell according to claim 6, wherein:
the first low-pass filter includes a first inductive element and an input port across the first output negative terminal and the second output positive terminal.

8. The power supply cell according to claim 7, wherein:
the first low-pass filter further includes an output port for supplying a third DC voltage across a positive output port terminal and a negative output port terminal.

9. The power supply cell according to claim 8, which further includes:
a third unidirectional semiconductor switch electrically connected with the first controllable unidirectional semiconductor switch in anti-parallel.

10. The power supply cell according to claim 6, which further includes:
a third unidirectional semiconductor switch electrically connected with the first controllable unidirectional semiconductor switch in anti-parallel.

11. The power supply cell according to claim 7, which further includes:
a third unidirectional semiconductor switch electrically connected with the first controllable unidirectional semiconductor switch in anti-parallel.

12. The power supply cell according to claim 6, wherein:
the first low-pass filter includes an output port for supplying a third DC voltage across a positive output port terminal and a negative output port terminal.

* * * * *